United States Patent [19]

Takano et al.

[11] Patent Number: 4,496,908
[45] Date of Patent: Jan. 29, 1985

[54] NEGATIVE FEEDBACK AMPLIFIER HAVING GAAS FET'S

[75] Inventors: Isamu Takano; Norihisa Ohta, both of Tokyo, Japan

[73] Assignee: Nippon Electric Co., Ltd., Tokyo, Japan

[21] Appl. No.: 387,810

[22] Filed: Jun. 14, 1982

[30] Foreign Application Priority Data

Jun. 16, 1981 [JP] Japan ................................ 56/92514

[51] Int. Cl.$^3$ ............................ H03F 3/16; H03F 1/34
[52] U.S. Cl. ...................................... 330/277; 330/293
[58] Field of Search ....................... 330/277, 291–293, 330/96

[56] References Cited

U.S. PATENT DOCUMENTS 3,286,189 11/1966 Mitchell et al. ..................... 330/277

OTHER PUBLICATIONS

J. Mestres, "Preamplicador A.F. para 27 MHZ", Revista Espanola De Electronica, Agosto–Septiembre, 1977.

Primary Examiner—James B. Mullins
Assistant Examiner—G. Wan
Attorney, Agent, or Firm—Laff, Whitesel, Conte & Saret

[57] ABSTRACT

A negative feedback amplifier has an amplifying section including a first GaAs FET with its source, gate and drain electrodes. A second GaAs FET has its drain electrode connected to the source electrode of the first GaAs FET. An input terminal is connected to the gate electrode of either the first or the second GaAs FET. A feedback circuit feeds back a part of the output given from the drain electrode of the other GaAs FET's to the gate electrode of the same GaAs FET.

11 Claims, 10 Drawing Figures

NEGATIVE FEEDBACK AMPLIFIER HAVING GAAS FET'S

The present invention relates to a negative feedback amplifier having "GaAs field effect transistors (hereunder referred to as GaAs FET's").

A GaAs FET, provides a high gain with an excellent signal to noise ratio, and finds extensive use in negative feedback amplifiers which are operable over a significantly broad frequency band. An example of such amplifiers using GaAs FET's is given in FIG. 1 of the U.S. Pat. No. 4,075,576. With a view to the stable operation, this amplifier is provided with a feedback loop, extending from the source electrode of the FET Q2 to the gate electrode of the FET Q1. However, since the feedback loop is connected to the input signal path, it is extremely difficult to separately set the input impedance and the amount of feedback of the amplifier. When the separate setting is provided the circuit design becomes very complicated.

An object of the present invention is, therefore, to provide an improved negative feedback amplifier, free from the above-mentioned disadvantages in the prior art negative feedback amplifier.

According to one aspect of the invention, a negative feedback amplifier has an amplifying section including a first GaAs FET having its source electrode, its gate electrode and its drain electrode. A second GaAs FET has its drain electrode connected to the source electrode of the first GaAs FET. An input terminal is connected to the gate electrode of one of the first and second GaAs FET's. An output terminal is connected to the drain electrode of the first GaAs FET. A feedback circuit provides for feeding back a part of the output given from the drain electrode of the other of the first and second GaAs FET's to the gate electrode of the same GaAs FET.

Other features and advantages of the invention will become more apparent from the detailed description hereunder, taken in conjunction with the accompanying drawings, wherein.

In the drawings, identical reference numerals denote identical structural elements.

Figure 1A:
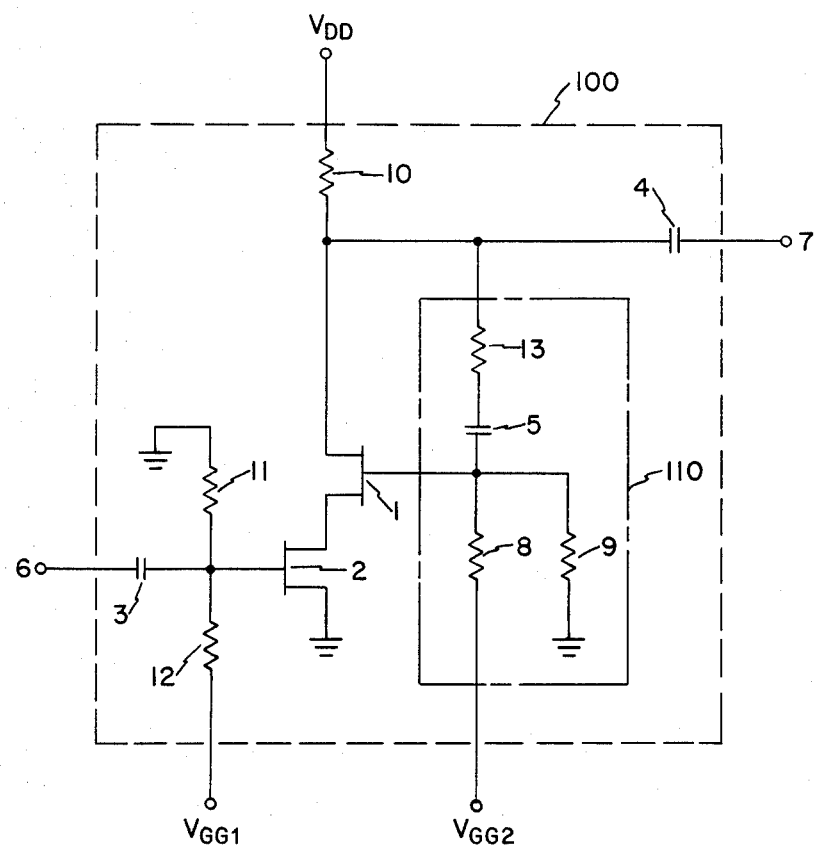
FIG. 1A is a circuit diagram of a first embodiment of the invention.

Referring to FIG. 1A, a negative feedback amplifier 100 of a first embodiment, comprises an amplifying section having GaAs FET's 1 and 2, each having its drain, source and gate electrodes. The drain electrode of the FET 2 is connected to the source electrode of the FET 1. An input terminal 6 is connected to the gate electrode of the FET 2. A feedback circuit 110 is coupled to the gate electrode of the FET 1 for feeding back a part of the output signal from the drain electrode of the FET 1. Capacitors 3 and 4 are coupled between the input and output terminals, respectively, and the amplifier 100 in order to block a direct current (D.C.). A resistance element 10 is a load connected to a positive power source $V_{DD}$. An output terminal 7 is connected to the drain electrode of the FET 1. Resistance elements 11 and 12 form a biassing circuit which is to be described later. The feedback circuit 110 further comprises a D.C. blocking capacitor 5, and resistance elements 8, 9, and 13 for determining the level of the fed back signal. The elements 8 and 9 also provide biassing circuit to fix the D.C. bias voltage, which is applied at the gate electrode of the FET 1. The elements 12 and 8 are connected to negative power sources $V_{GG1}$ and $V_{GG2}$, respectively.

An input signal is given to the input terminal 6. After its D.C. component has been blocked by the capacitor 3, it is supplied to the gate electrode of the FET 2. The D.C. bias voltage applied at the gate electrode of the FET 2 is determined by the biasing circuit composed of the resistance elements 11 and 12. A signal is amplified by the FET's 1 and 2, is taken from the drain electrode of the FET 1, and supplied through the capacitor 4 to the output terminal 7.

On the other hand, to the gate electrode of the FET 1 is fed back a part of the output from the drain electrode of the FET 1, the feedback being by way of a feedback resistance element 13 and a capacitor 5 of the circuit 110. The first embodiment is equipped with the FET's 1 and 2, connected in series. The input signal path and the feedback loop are separated from each other. Therefore, the input impedance and the level of the feedback signal are determined independently of each other. With the above embodiment, the input signal and the negative feedback signal are fed to the gate electrode of the FET 2 and of the FET 1, respectively.

Figure 1B:
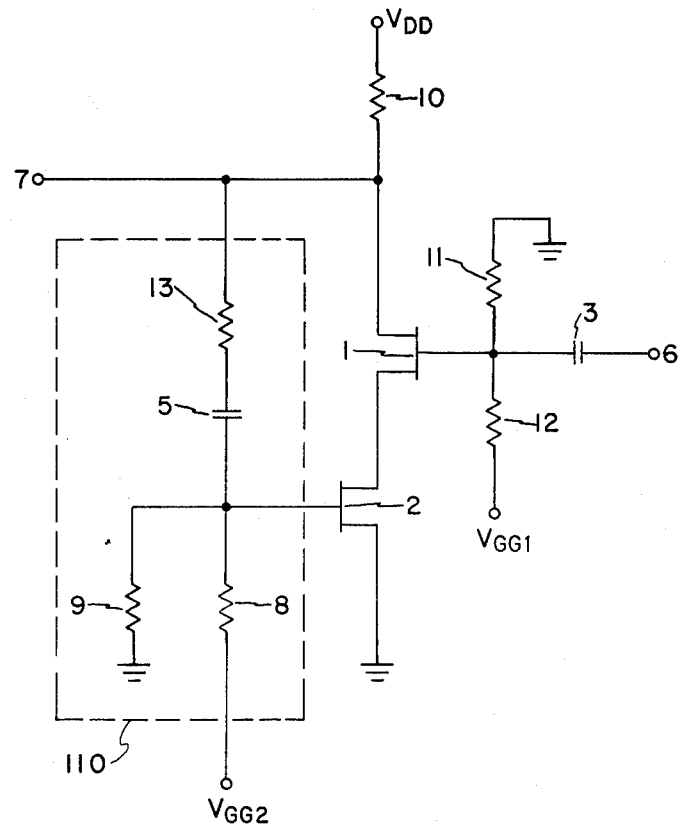
FIG. 1B is a diagram of a modification of the structure shown in FIG. 1A.

However, exactly the same technical effect can be achieved by employing the structure shown in FIG. 1B in which those same signals are given to the gate electrodes of the FET 2 and of the FET 1, respectively.

Figure 2:
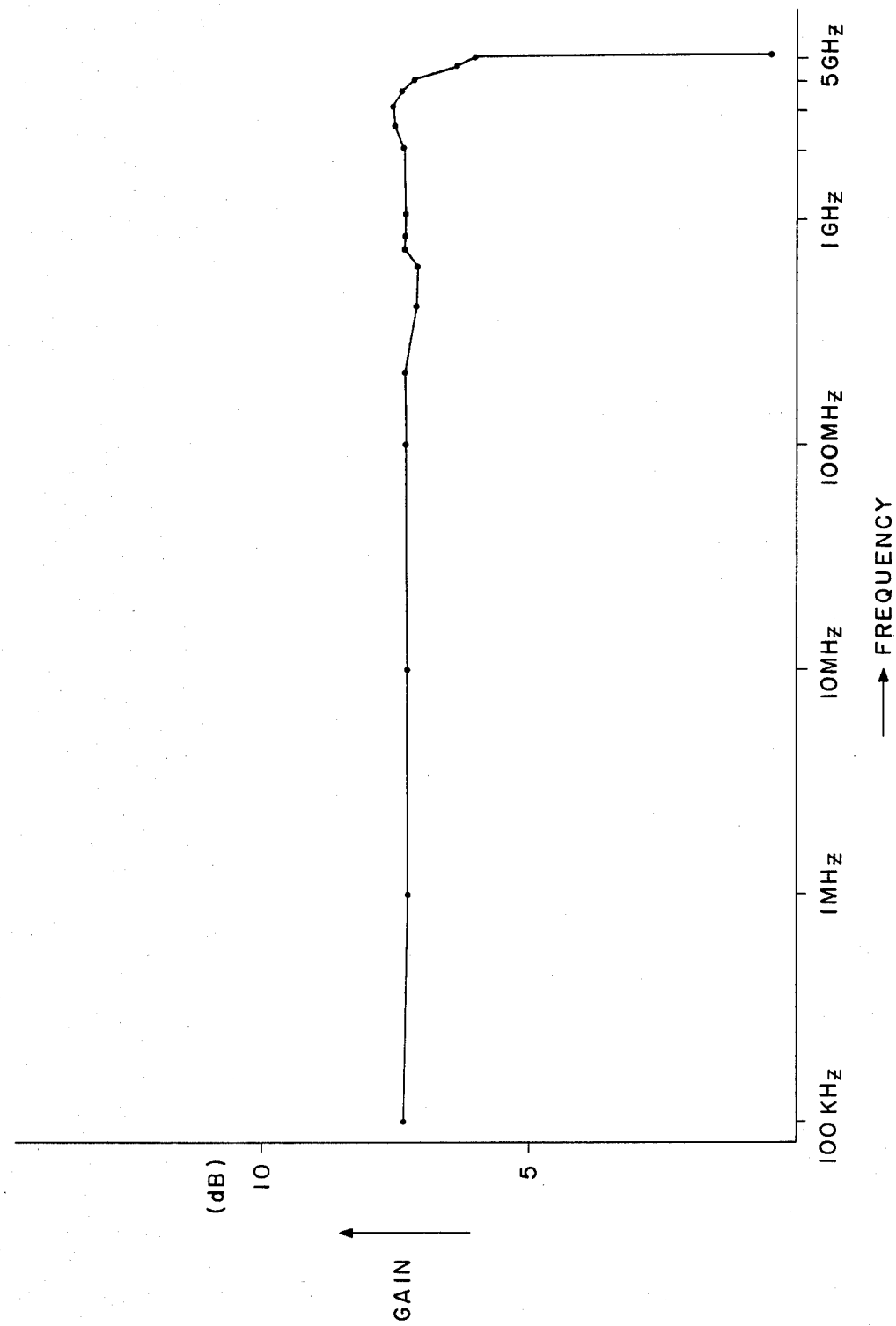
FIG. 2 is a diagram for describing a frequency-gain characteristic achieved by the first embodiment.

As is evident from the frequency-gain characteristic shown in FIG. 2, the embodiment of FIG. 1A functions as a broadband amplifier having a ±0.5 dB flatness ranging from 100 KHz to 5 GHz.

Figure 3:
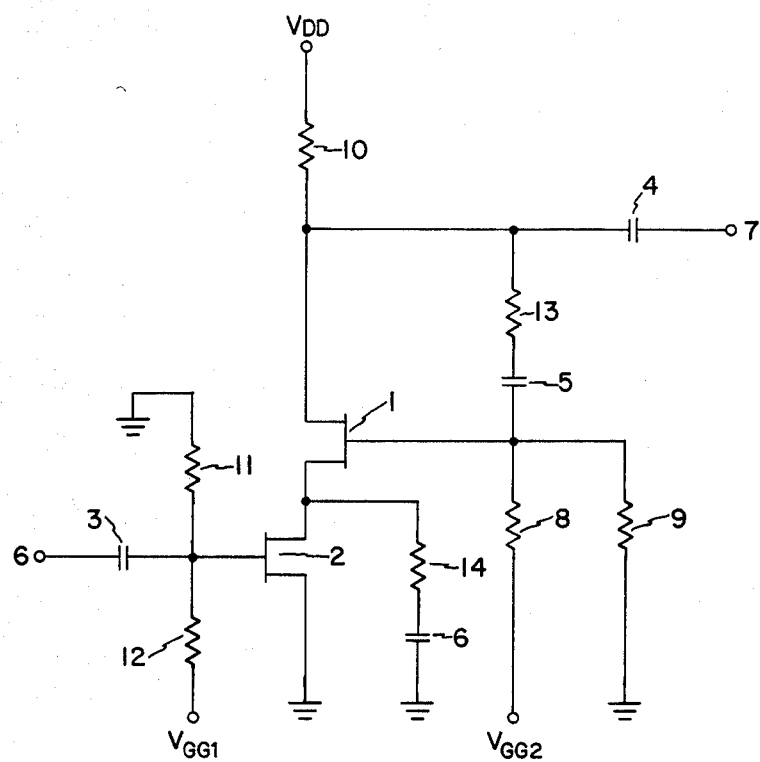
FIGS. 3 to 9 are diagrams respectively illustrating second through eighth embodiments.

Referring now to FIG. 3, a second embodiment includes all of the structure of FIG. 1A. In addition, it includes a resistance element 14 having one of its ends connected to the drain electrode of the FET 2. A D.C. blocking capacitor 19 has one side connected to the other end of the element 14 and the other side connected to ground. This additional structure permits the gain of the feedback path of the FET 1 to be set at its required level, without sacrificing the gain of the FET 2.

Figure 4:
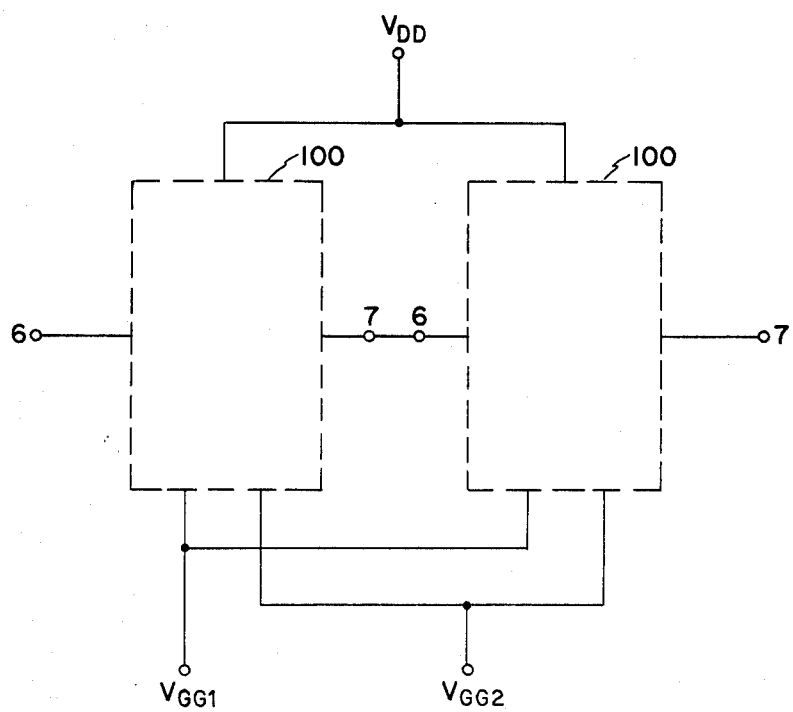

FIG. 4 illustrates a third embodiment which has two amplifiers 100 connected in a cascade arrangement, each having the structure shown in FIG. 1A. It should be noted that the capacitor 3 in the input section of the amplifier 100 may be eliminated in the second stage, because the capacitor 4 used in the output section of the preceding stage can concurrently perform its function.

Generally, the output impedance of an amplifier should, desirably, be low so that its amplifying performance may not vary with the load connected thereto.

Figure 5:
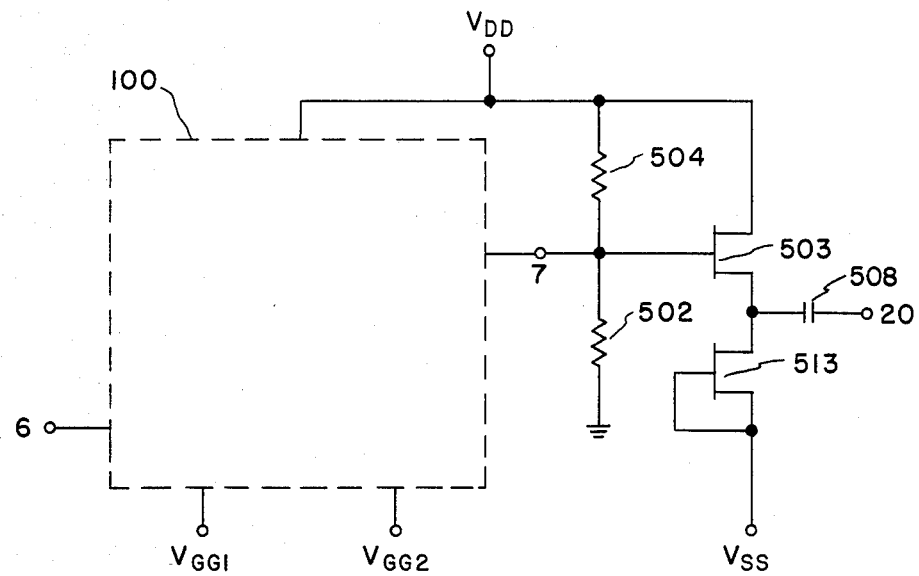

Referring to FIG. 5, a fourth embodiment is designed to reduce the above described output impedance. The amplifying section 100 is the same as that shown in FIG. 1A. A GaAs FET 503 functions as a source follower. A GaAs FET 513 provides a constant current source. Resistance elements 502 and 504 form a biasing circuit for setting the D.C. bias voltage at the gate electrode of the source follower. A D.C. blocking capacitor 508 is provided at the output end. With this structure, the output impedance of the source follower is approximately 1/gm ohms, where "gm" is the transfer conductance of the FET 503. Consequently, the amplifier shown in FIG. 5 can provide a low output impedance of 10 to 30 ohms. The FET 513 is used as the current source in the amplifier of FIG. 5. However, a resistance element may be substituted for FET 513 if a sufficiently large negative power source ($-V_{ss}$) is provided.

Figure 6:
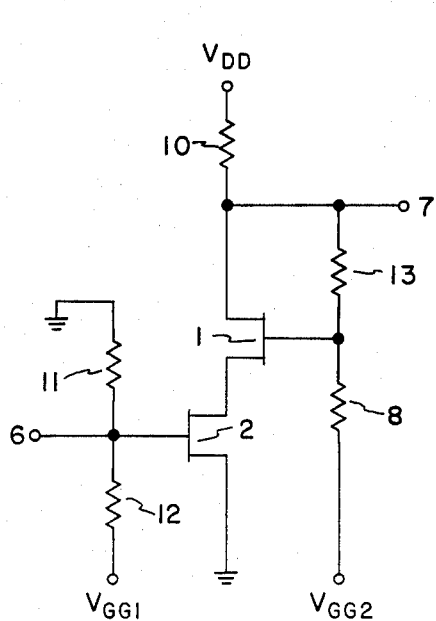

Referring now to FIG. 6, a fifth embodiment has a D.C.—coupled structure which is achieved by eliminating the capacitors 3, 4 and 5 from the structure of FIG. 1A. The fifth embodiment can provide a highly stable negative feedback amplifier which is operable even in the D.C. region. Furthermore, it will be evident that the structure of FIG. 6 is suitable for the circuit integration, because no capacitors are employed therein.

Figure 7:
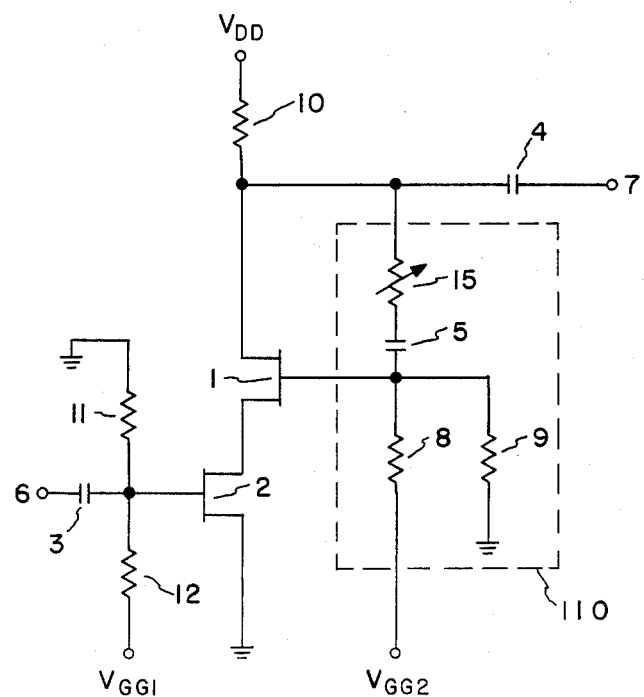

A sixth embodiment 200 illustrated in FIG. 7 has exactly the same structure as the embodiment shown in FIG. 1A except that a variable resistance element 15 is employed in the feedback circuit 110, instead of the fixed resistance element 13 shown in FIG. 1A. A feedback signal is supplied to the FET 1 by way of the element 15. The level of the feedback signal is determined by the ratio between the resistance of the resistance element 15 and the parallel resistances of the resistance elements 8 and 9. Therefore, the gain of the amplifier can be easily varied by manipulating the variable resistance element 15. Also, the D.C. bias voltage applied at the gate electrode of the FET 1 is determined by the parallel resistances of the elements 8 and 9. The D.C. operating point of the FET 1 remains constant even if the resistance element 15 is varied.

In FIG. 7, the level of the feedback signal is varied by an adjustment of the resistance element 15 which is inserted between the output signal path and the gate electrode of the FET 1. However, it may also be varied, as in a seventh embodiment illustrated in FIG. 8.

Figure 8:
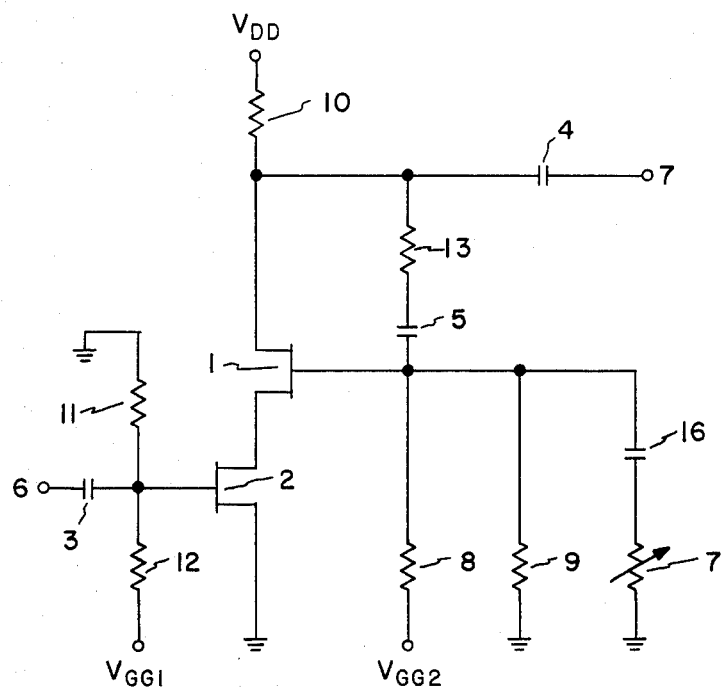

Referring to FIG. 8, the resistance element 15 used in FIG. 7 is replaced by the fixed resistance element 13. Further, a variable resistance element 17 is inserted between the gate electrode of the FET 1 and the common ground. A capacitor 16 is employed to block a D.C. given from the power source $V_{GG2}$ to the resistance element 17. With this structure, the level of the feedback signal, determined by the resistance elements 8, 9, 13, and 17, can be varied by an adjustment of the variable resistance element 17.

Figure 9:
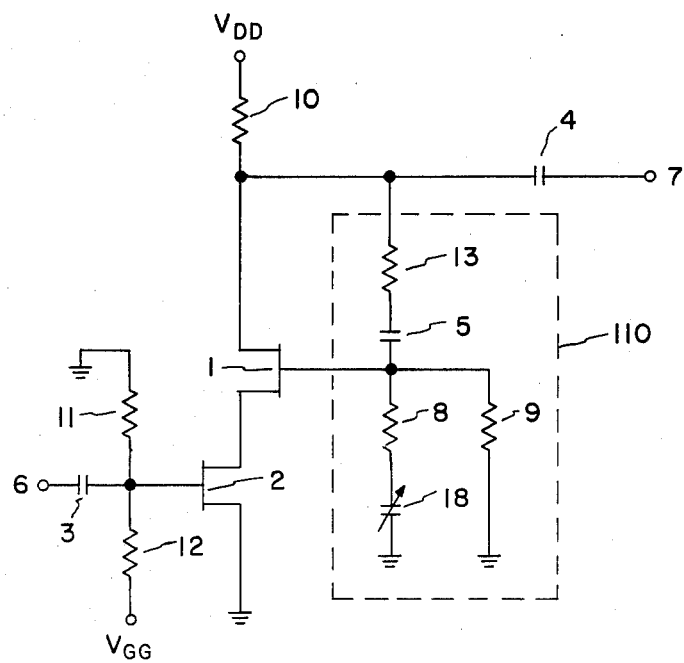

Referring to FIG. 9, an eighth embodiment has the same structure as the first embodiment shown in FIG. 1A, except that an adjustable D.C. voltage source 18 is connected to the resistance element 8, for varying the D.C. bias voltage at the gate electrode of the FET 1. In this embodiment, the gate electrode of the FET 1 is supplied with a variable D.C. voltage from the voltage source 18, in addition to the feedback signal given through the resistance element 13 and the capacitor 5. Therefore, the output of the voltage source 18 results in a change in the D.C. bias voltage given at the gate electrode of the FET 1, which is determined by the voltage division ratio between the resistance elements 8 and 9. Thus, by the use of the variable D.C. voltage source 18, the gain can be made variable.

For practical use, each of the resistance elements 8 to 14 used in FIGS. 1A, 1B 6 to 9 may be made up of a conventional resistor or an MOS (metal oxide semiconductor) FET. Each of the variable resistance elements 15 and 17 may be composed of a conventional variable resistor or a PIN diode.

Each of the structures illustrated in FIGS. 7 through 9 can be used with the add on structures shown in FIGS. 1B, 4, 5, and 6.

As above described, the present invention achieves a broadband negative feedback amplifier capable of setting the input impedance and the quantity of the feedback signal independently of eath other.

What is claimed is:

1. A negative feedback amplifier comprising: an amplifying section including a first GaAs FET coupled in an amplifier configuration and having source, gate, and drain electrodes; a second GaAs FET coupled in an amplifier configuration and having source, gate and drain electrodes; the drain electrode of said second GaAs FET being connected to the source electrode of the first GaAs FET; an input terminal connected to the gate electrode of either one of the first and second GaAs FET's; an output terminal connected to the drain electrode of the first GaAs FET; and a feedback circuit coupled between the drain and the gate of the other of said GaAs FET's for feeding back a part of the output given from the drain to the gate electrodes of the other GaAs FET of said first and second FET's.

2. A negative feedback amplifier as claimed in claim 1, wherein the feedback circuit comprises a variable resistor.

3. A negative feedback amplifier as claimed in claim 1 further comprising means connected to the gate electrode of said other GaAs FET of said amplifying section for controlling the direct current (D.C.) bias voltage applied at the gate electrode of said other GaAs FET.

4. A negative feedback amplifier as claimed in claim 3, wherein said gate electrode voltage control means comprises a variable D.C. voltage source.

5. A negative feedback amplifier as claimed in claim 1 further comprising a capacitor connected to said input terminal for blocking a given direct current and means for applying bias voltages to the gate electrodes of said first and second GaAs FET's.

6. An amplifier comprising a pair of GaAs FET's coupled in an amplifier configuration and having their source and drain circuits connected in series between ground and battery, an input terminal means coupled to a gate of one of said FET's and an output terminal coupled to the drain of the other of said FET's, and feedback means connected between the drain and a gate of said other FET.

7. The amplifier of claim 6 wherein said feedback means comprises a voltage divider formed by a resistor coupled between said drain and gate of said other FET and a pair of resistors coupled between ground and said battery.

8. The amplifier of claim 7 and means for varying the ratio of said voltage divider.

9. The amplifier of claim 8 wherein said means for varying said ratio is a variable resistor.

10. The amplifier of claim 8 wherein said means for varying said ratio is a variable battery.

11. The amplifier of claim 7 and means connected to the drain of said one FET for setting the gain of said amplifier independently of the gain of said feedback means.

* * * * *

UNITED STATES PATENT AND TRADEMARK OFFICE
CERTIFICATE OF CORRECTION

PATENT NO. : 4,496,908
DATED : January 29, 1985
INVENTOR(S) : TAKANO, ET AL.

It is certified that error appears in the above—identified patent and that said Letters Patent is hereby corrected as shown below:   On the title page;

Please correct the Assignee of record as it presently appears in the above-identified patent, as follows:

--NIPPON ELECTRIC CO., LTD. AND NIPPON TELEGRAPH & TELEPHONE PUBLIC CORPORATION.--

Signed and Sealed this

Twenty-third Day of July 1985

[SEAL]

Attest:

DONALD J. QUIGG

Attesting Officer    Acting Commissioner of Patents and Trademarks